(12) United States Patent
York et al.

(10) Patent No.: US 8,643,281 B2
(45) Date of Patent: Feb. 4, 2014

(54) SIGNAL GENERATION SYSTEM

(75) Inventors: Andrew David York, Bristol (GB); Brian Halsall, Bristol (GB); Gregory Ian Chance, Bristol (GB)

(73) Assignee: Oxford Instruments Nanotechnology Tools Limited, Oxfordshire (GB)

( * ) Notice: Subject to any disclaimer, the term of this patent is extended or adjusted under 35 U.S.C. 154(b) by 128 days.

(21) Appl. No.: 13/141,938

(22) PCT Filed: Dec. 22, 2009

(86) PCT No.: PCT/GB2009/002935
§ 371 (c)(1),
(2), (4) Date: Dec. 5, 2011

(87) PCT Pub. No.: WO2010/073006
PCT Pub. Date: Jul. 1, 2010

(65) Prior Publication Data
US 2012/0074844 A1   Mar. 29, 2012

(30) Foreign Application Priority Data

Dec. 24, 2008 (GB) .................................. 0823565.7

(51) Int. Cl.
*H05H 1/46* (2006.01)
*C23C 16/00* (2006.01)

(52) U.S. Cl.
USPC ............ 315/111.21; 118/723 E; 118/723 ER; 118/723 I; 156/345.43

(58) Field of Classification Search
USPC .................. 315/111.21; 156/345.43, 345.44, 156/345.47, 345.51
See application file for complete search history.

(56) References Cited

U.S. PATENT DOCUMENTS

| 5,643,364 | A | * | 7/1997 | Zhao et al. | 118/723 E |
| 6,005,398 | A | | 12/1999 | Landt | |
| 8,018,163 | B2 | * | 9/2011 | Wi | 315/111.21 |
| 8,018,164 | B2 | * | 9/2011 | Shannon et al. | 315/111.21 |
| 8,120,259 | B2 | * | 2/2012 | Kim et al. | 315/111.21 |
| 8,267,041 | B2 | * | 9/2012 | Abe et al. | 118/723 E |
| 8,357,264 | B2 | * | 1/2013 | Shannon et al. | 156/345.28 |
| 2009/0140722 | A1 | * | 6/2009 | Mann et al. | 324/120 |

FOREIGN PATENT DOCUMENTS

| EP | 1995759 A2 | 11/2008 |
| GB | 2315620 A | 2/1998 |

* cited by examiner

*Primary Examiner* — Vibol Tan
(74) *Attorney, Agent, or Firm* — Blank Rome LLP

(57) ABSTRACT

A signal generating system comprises a signal generator (14) for generating an electrical signal at a predetermined frequency; an impedance matching circuit (16), the electrical signal being supplied from the signal generator (14) via the impedance matching circuit (16) to a reactive load (10) in use; and an impedance matching control system (30) for detecting the electrical signal between the signal generator and the reactive load and for adjusting the impedance matching circuit (16) to achieve a predetermined condition. The impedance matching circuit control system (30) comprises a heterodyne circuit, and the system further comprises a heterodyne frequency generator (48) coupled to the signal generator (14) to generate a second, heterodyne frequency from the predetermined frequency from the signal generator. This second, heterodyne frequency is mixed with the detected signal to generate sum and difference signals. A filter (50, 52) passes the difference signal and a processor (Magnitude control; Phase control; 26; 28) responsive to the difference signal is used to adjust the impedance matching circuit (16) to achieve the predetermined condition.

14 Claims, 5 Drawing Sheets

Sideband distortion of a 13.56 MHz Signal with a 400 kHz signal.

Showing sideband distortion of a 13.56 MHz signal with a 400 kHz signal photographed from a spectrum analyser.

Heterodyne frequency conversion of spectrum in figure 3.

Heterodyne frequency converted spectrum is much easier to filter.

SIGNAL GENERATION SYSTEM

REFERENCE TO RELATED APPLICATION

The present application is a National Stage of International Patent Application No. PCT/GB2009/002935, filed Dec. 22, 2009, published on Jul. 1, 2010, as WO 2010/073006 A1, which claims the benefit of GB 0823565.7 filed Dec. 24, 2008, whose disclosures are hereby incorporated by reference in their entirety into the present disclosure.

The present invention relates to apparatus for impedance matching.

Plasma treatment systems of various designs are known for performing treatments such as the etching of substrates or the deposition of thin layers upon substrates. This is achieved by the formation of plasmas within low pressure gases. The plasma is initiated and sustained by plasma generators and impedance matching networks are employed to ensure a 50 ohm impedance is seen by the generator(s) looking into the load.

In a typical plasma treatment system, a plasma chamber operating at a high RF frequency (e.g. 13.56 MHz) holds a semiconductor wafer or substrate and performs a desired process on the wafer, such as plasma etching, plasma-enhanced chemical vapour deposition, or sputtering. In order to maintain a plasma within the chamber, RF power is furnished to the chamber by a conventional 13.56 MHz RF generator via a transmission line (such as a 50 ohm coaxial cable) and a variable RF impedance matching circuit. The conventional RF generator includes a 13.56 MHz RF power source, an output stage, and a conventional dual directional coupler. The output stage matches the output impedance of the RF power circuit to the characteristic impedance of the coaxial cable of 50 ohms. A dual directional coupler forming sense circuitry provides outputs indicative of the forward and reflected RF power at the output of the output stage. A conventional feedback control circuit governs the variable RF match circuit in such a manner as to minimize the reflected RF power sensed at the reflected power output of the dual directional coupler. Specifically, the control circuit adjusts the variable RF match network so as to transform the impedance of the plasma chamber to the 50 ohm characteristic impedance of the coaxial cable. Since the plasma chamber impedance tends to vary during wafer processing, the variable RF match circuit maintains an RF match by changing its impedance to compensate for fluctuations in the plasma chamber impedance.

One such prior art system is disclosed in U.S. Pat. No. 5,643,364 and another in WO-A-1997/024748. In this latter case, the matching unit is comprised of two variable reactances controlled by a microprocessor. The two elements are moved sequentially until the minimum reflected power is found.

The sense circuitry on match networks used to detect the output signal from the plasma generator will generally detect frequencies other than the frequency that the match unit is designed to match to. Problems arise when harmonics generated, as a result of the interaction of the plasma generator's output signal with the nonlinear reactance of the plasma, are also detected by the match networks sense circuitry. This scenario may lead to erroneous reflected power readings or false drive signals for the variable reactive elements of the match network control. Ultimately this leads to slow matching or a match which will not deliver the optimum power into the plasma.

Furthermore, plasma generators on a single plasma processing reactor can sometimes number greater than one and the output frequency of the generators may be dissimilar. In these cases it is important that there is no cross-talk between the impedance matching networks of the generators. In some cases harmonic distortion of the sense signal, used to automatically drive the match unit, can lead to unwanted behaviour and poor matching. This is of particular importance when consistent delivery of power to the plasma reactor and the speed of impedance matching are critical. In this case, drive signal distortion may be exaggerated when the two or more frequencies interact either through direct physical connection or conduction through the plasma. The superposition of the two or more frequencies can lead to sideband generation of the sum and difference of said frequencies. In the case of one of the two or more frequencies being relatively low (for example, a hundred kHz) the sideband generation can be prolific and the distortion of the sense signal used to drive the match network can be very severe. This type of distortion may also result in erroneous reflected power readings from the generator and poor matching due to false drive signals to the variable reactive elements of the match network.

GB 2315620 A describes an RF probe for a plasma chamber that picks up current and voltage samples of the RF power applied to an RF plasma chamber, and the RF voltage and current waveforms are supplied to respective mixers. A local oscillator supplies both mixers with a local oscillator signal at the RF frequency plus or minus about 15 kHz, so that the mixers provide respective voltage and current baseband signals.

U.S. Pat. No. 6,005,398A describes the conversion of signals derived from an RF signal to a sinusoidal signal. This sinusoidal signal is preferably at a lower frequency, preferably 25 kHz.

There is therefore an ongoing desire within the industry to provide improved apparatus with better performing matching networks, improved matching times and reliability of matching without interference of frequencies from other plasma generators on the same plasma processing reactor.

In accordance with the present invention, a signal generating system comprises a signal generator for generating an electrical signal at a predetermined frequency; an impedance matching circuit, the electrical signal being supplied from the signal generator via the impedance matching circuit to a reactive load in use; and an impedance matching control system for detecting the electrical signal between the signal generator and the reactive load and for adjusting the impedance matching circuit to achieve a predetermined condition, and is characterized in that the impedance matching circuit control system comprises a heterodyne circuit, the system further comprises a heterodyne frequency generator coupled to the signal generator to generate a second, heterodyne frequency from the predetermined frequency from the signal generator for mixing with the detected signal to generate sum and difference signals; a filter for passing the difference signal; and a processor responsive to the difference signal to adjust the impedance matching circuit to achieve the predetermined condition.

We have realised that, in contrast to prior art systems, improved matching can be achieved by the use of heterodyne frequency conversion of the signal in the sense circuitry. Shifting the frequency of the signal used for matching makes it simpler to manipulate during the rest of the signal processing. Down-converting from the LF, RF, VHF or UHF frequency required for plasma processing to a frequency of a few hundred hertz requires simple filtering giving a clean signal free from any harmonic or unwanted sideband distortion.

The sense sampling and processing control for the match network of the present invention works upon the principal of the heterodyne receiver. The output signal from the signal generator which has a frequency ($F_P$) is typically detected, at any point on the transmission line between the generator and the reactive load, such as a reactor chamber, through a voltage sensor and current transformer, to give two different signals related to the (RF) power delivery. These two signals are then mixed with a local oscillator source similar in frequency to that of the generator. The local oscillator (LO) frequency ($F_{LO}$) can be chosen to be slightly higher or lower than that of the generator. An exact reproduction of the sampled spectrum is then reproduced at the difference and sum frequencies. By carefully selecting the local oscillator frequency, the difference frequency can be used for further signal processing.

Although the invention is applicable to a wide variety of signal generating systems connected to reactive loads through an impedance matching circuit such as RF induction heating, the primary application of the invention is to a plasma chamber excitation system and the following description will relate specifically to that application.

The advantage of using the difference frequency for signal processing is that the frequency can be low compared to the frequency of the plasma generator depending on the value of the LO frequency. For example, a plasma generator operating at 13.56 MHz is mixed with a LO frequency of 13.5599 MHz. A reproduction of the spectrum can now be found at 100 Hz and 27.1 MHz. This 100 Hz signal is much easier to filter and process in a standard Printed Circuit Board (PCB) than signals at $F_P$.

The true advantage of this system is seen when two plasma generators are operating at different frequencies on the same reactor. If the second plasma generator has a frequency ($F_{P2}$) of 400 kHz, we can observe the effect this has on the 13.56 MHz signal. Both signals will mix together and sidebands will appear at 13.96 MHz and 13.16 MHz, equivalent to the sum and difference, with reduced amplitude comparative to the 13.56 MHz signal. Further sidebands will be produced at 14.36 MHz and 12.76 MHz with further reduction to the signal amplitude and similarly for 14.76 MHz and 12.36 MHz.

Attempting to isolate the 13.56 MHz signal from such a spectrum would be very difficult as the difference between the Sense Signal required for impedance matching (13.56 MHz) and those not required (13.16 MHz, 13.96 MHz etc.) is very small. As a result the signals controlling the variable reactive elements of the matching network would be affected by these sideband distortions, usually to a point of being unusable and consequently the impedance network will fail to find a match.

By performing the heterodyne frequency conversion on the 13.56 MHz Sense Signal the corresponding signal is found at 100 Hz, which shall now be referred to as the Modified Sense Signal (MSS), with the closest sideband (lower first sideband harmonic) at 399'900 Hz which is much easier to isolate through filtering. Simple low-pass filtering can then be used to isolate the 100 Hz signal free from sideband distortion.

The choice of the LO frequency ($F_{LO}$) depends on the plasma generator output frequency and the chosen Modified Sense Signal frequency used for signal processing. For an impedance match network operating at 13.56 MHz an $F_{LO}$ of 13.5599 MHz gives a Modified Sense Signal frequency of 100 Hz. The scope of this patent does not limit the apparatus or method to these values. The user may wish to choose an $F_{LO}$ of 13.5595 MHz giving a Modified Sense Signal frequency of 500 Hz.

To illustrate the point further, assume a plasma is initiated and sustained by a plasma generator with frequency $F_{P1}$=13.56 MHz and a second plasma generator with frequency $F_{P2}$=2.00 MHz. To give a Modified Sense Signal frequency of 100 Hz the LO frequency should be $F_{LO}$=13.5599 MHz. This gives the first harmonic lower sideband at 1.9999 MHz.

In another example, frequencies of 41 Mhz and 13.56 Mhz could be used.

Theoretically the user may define and use any value of $F_{LO}$ but only some frequencies relative to the operating frequency of the matching network are suitable to allow for simple filtering and signal processing. The value of $F_{LO}$ frequencies that result in a Modified Sense Signal frequency that is simple to process using low-pass filters when concerned with the sideband distortion from two frequencies; the primary plasma generator frequency ($F_{P1}$) and a secondary plasma generator source ($F_{P2}$), will tend to fall into a range described by the following equations, $$F_{LO,MAX} < F_{P1} + (F_{P2}/2) \quad \text{[EQ. 1.1]}$$

$$F_{LO,MIN} = 0.9 \times F_{P1} \quad \text{[EQ. 1.2]}$$

The maximum limit to the LO frequency described in EQ. 1.1 will just cut-off the first harmonic lower sideband. An LO frequency chosen closer to the lower limit, as described by EQ. 1.2, will give a Modified Sense Signal frequency further from $F_{P2}$ and therefore simpler to use as a control signal for the matching network by implementing a low-pass filter.

This invention is not limited to the use of the LO frequency to just the range described by EQ. 1.1 & 1.2, rather this is the range which is the simplest to filter. If so required the choice of $F_{LO,MAX}$ may fall into the category descried by EQ. 1.3, $$F_{LO,MAX} > (F_{P2}/2). \quad \text{[EQ. 1.3]}$$

If the value of $F_{LO}$ is to be taken from the range described by EQ. 1.3 then band-pass filtering must be adopted in order to isolate the MSS. The implementation of band-pass filtering is less trivial than that of low-pass filtering. In some cases this may be the preferred choice but in most instances the low-pass filtering will be the economical choice.

The type of filtering use to isolate the heterodyne frequency converted signal from the unwanted sidebands may be done through conventional filtering hardware. The filtering may also be performed by software capable of performing a similar task.

The new method and apparatus for impedance matching to a reactive load and chamber described above can operate at any frequency desirable to initiate and sustain a plasma. This may include but not be limited to; the Low Frequency (LF) region of the Electromagnetic (EM) spectrum (30-300 kHz), the Medium Frequency (MF) region of the EM spectrum (300-3000 kHz), the High Frequency (HF) region of the EM spectrum (3-30 MHz), the Very High Frequency (VHF) region of the EM spectrum (30-300 MHz) and the Ultra High Frequency (UHF) region of the EM spectrum (300-3000 MHz). The frequencies used may be Continuous Wave (CW) or pulse operated.

The pulse frequency of the plasma generator may be in the range of 1-10,000 Hz. Pulsing the plasma generator will also produce unwanted sidebands that can distort the carrier signal. This patent describes a method that may help remove some of the unwanted distortion resulting from a pulsed plasma generator in comparison to a system that does not employ the heterodyne frequency conversion system.

The output of the plasma generator may also be superimposed with the output from one or more other plasma generators to gain the required properties to the plasma.

The impedance matching network apparatus described in this patent can be configured to match to capacitive or inductive loads. This may be achieved through the implementation of, but not limited to, L-type or Pi-type network configurations. The implementation of switched transformers is also possible.

The variable reactive elements of the impedance matching network of the current invention may be variable capacitors or variable inductors or any combination of one or more of the two. Furthermore, the implementation of a single variable reactive element may be used, in conjunction with frequency tuning the generator as a means of attaining two variable reactive elements.

The method and apparatus of this invention can be used with, but not limited to, impedance matching for any combination of one or more of the following plasma sources; Reactive Ion Etch (RIE), Ion Beam Etch, Ion Beam Deposition, Plasma Etch (PE), Plasma Enhanced Chemical Vapour Deposition (PECVD), Inductively Coupled Plasma (ICP), Plasma-enhanced Atomic Layer Deposition (PEALD) and any other equipment that requires a matching network.

Processes run in semiconductor processing equipment require quick and accurate matching between the plasma generator and the chamber and plasma which comprise the load. This can be achieved using digital signal processing wherever possible. Surface mounted components and programmable IC (Integrated Circuit) chips improve the latency of the control signals passing through the match unit's control PCB's. Digital signal processing gives a better response to changes in the plasma characteristics and the implementation of programmable stepper motors allow the variable reactive element(s) to be tuned quickly and accurately. It should be understood, however, that the invention could be implemented using analogue techniques.

An example of a signal generating system according to the invention will now be described with reference to the accompanying drawings, in which:—

Figure 1:
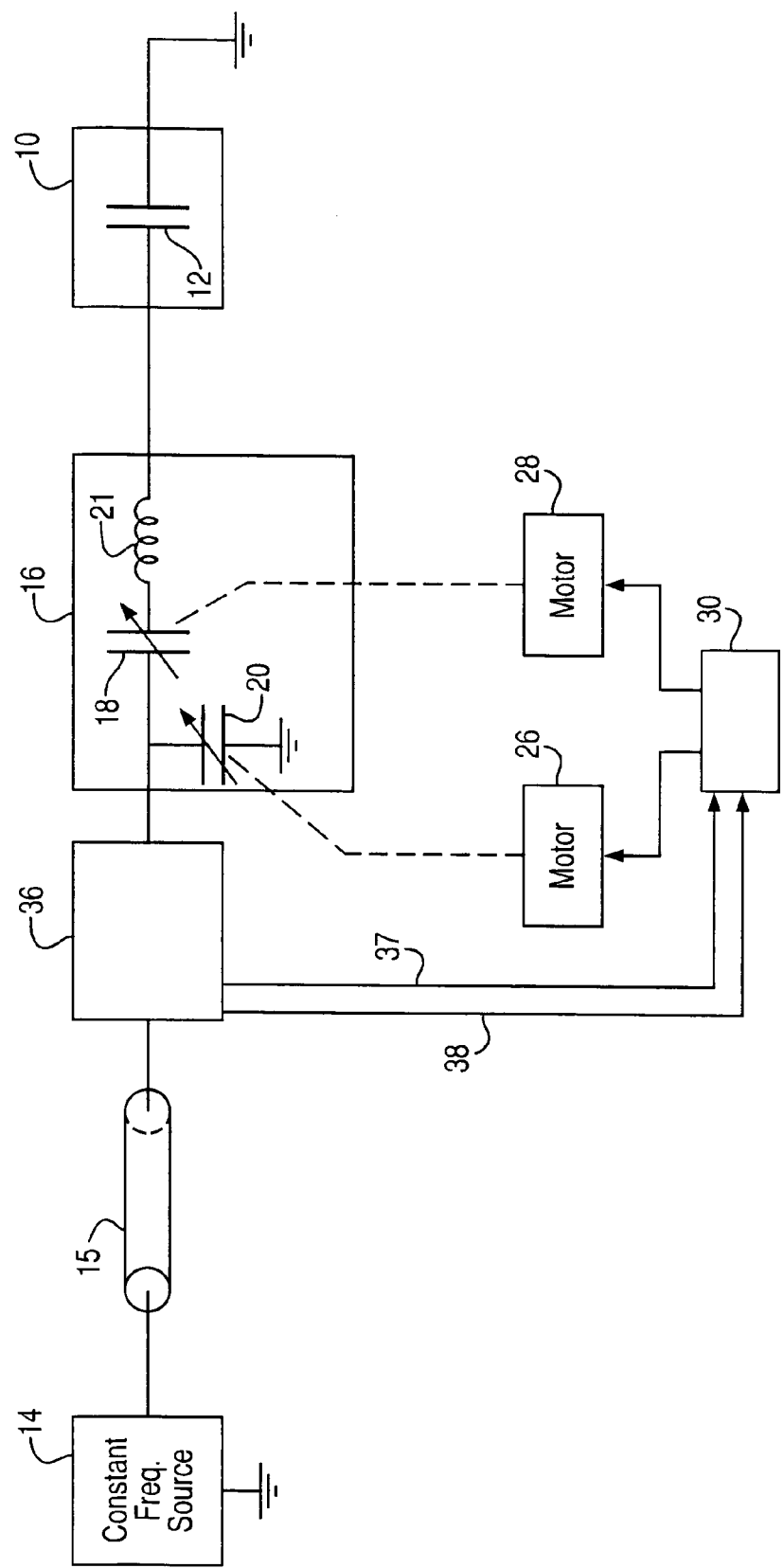
FIG. 1 is a block diagram illustrating a plasma chamber system.

FIG. 1 illustrates in block diagram form an example of a plasma chamber system including a vacuum plasma processing chamber 10 having an electrode 12, connected to constant frequency (typically 13.56 MHz) RF source 14 by way of a resonant matching circuit or network 16. Vacuum plasma processing chamber 10 is of conventional design, where gas is introduced and excited to and maintained in a plasma state by an RF field derived from electrode 12. A workpiece, typically a glass, semiconductor or metal substrate (not shown) located in chamber 10 is processed by ions in the plasma discharge so the workpiece is etched and/or material is deposited thereon. The plasma discharge forms a reactive load for the source 14 and resonant matching network 16. Source 14 is connected to network 16 by cable 15.

Source 14 has a resistive output impedance, e.g. 50 ohms, and usually a zero ohm reactive output impedance, i.e. the impedance seen looking into output terminals of source 14 is (50+j0) ohms. Cable 15 has a characteristic impedance at the frequency of source 14 equal to the output impedance of the source, and delivers the RF signal from the source to the input of the matching unit. An RF detection circuit 36, located at the input of the matching network 16, includes output ports 37, 38 on which are derived RF signals having amplitudes directly proportional to the voltage and current respectively of RF power reflected via cable 15 to the output terminal of source 14. The signals at ports 37, 38 are supplied to an impedance matching network control system 30 to be described below.

The plasma discharge in chamber 10 is subject to transient and nonlinear variations, which are reflected by matching network 16 and cable 15 to output terminals of constant frequency RF source 14. Impedances of matching network 16 are controlled to minimize the power reflected back to the output terminals of source 14 despite these variations.

In a preferred embodiment, matching network 16 is configured as a "L", having one series arm and one shunt arm, respectively including variable capacitors 18 and 20 whose capacitances can be varied using motors 26, 28 respectively. Capacitor 18 primarily controls the magnitude of the reactive impedance component seen looking into the input terminals of matching network 16 from source 14, while capacitor 20 primarily controls the magnitude of the resistive impedance seen looking into the matching network. Frequently, capacitors 18 and 20 are respectively referred to in the art as the tune and load reactances or capacitors. When connected to an electrode immersed in the plasma, the load impedance is substantially capacitive, and the matching unit includes an inductor 21 in series with the tune capacitor 18; the pair act electrically as a variable inductor in this case. When connected to an inductive load, such as the drive coil of an inductively coupled plasma, inductor 21 is omitted. The shunt capacitor 20 is connected on the input side of the matching unit when matching to loads lower than 50 ohms, and is positioned on the output side for loads higher than 50 ohms.

Figure 2:
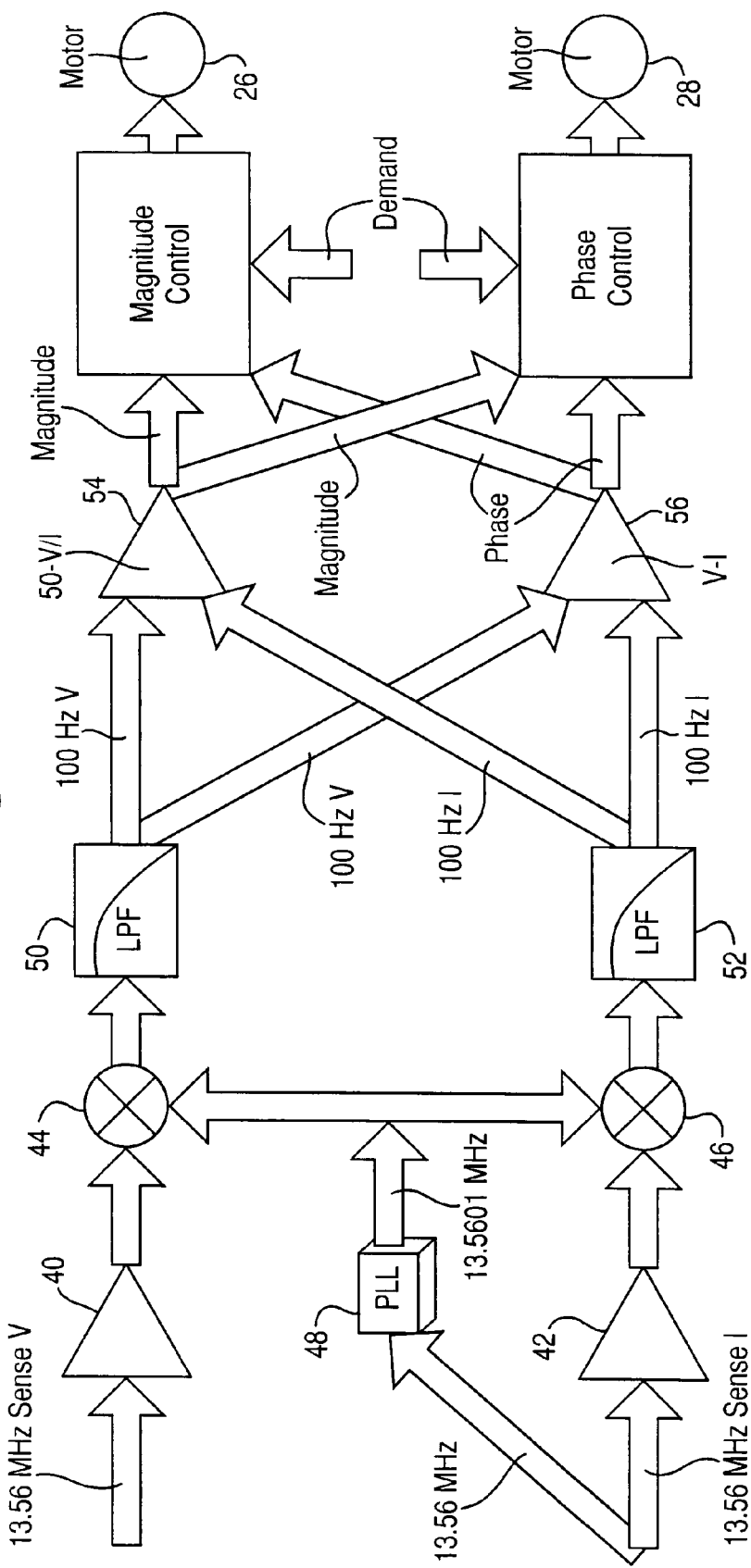
FIG. 2 is a block diagram illustrating the components of the impedance matching circuit control system shown in FIG. 1.

FIG. 2 illustrates the construction of the impedance matching circuit control system in more detail. Each of the incoming RF signals representing voltage and current respectively is fed to a respective amplifier 40, 42 and the amplified signals are fed to respective mixers 44, 46. The initial RF signal at 13.56 MHz is also fed to a phase lock loop circuit 48 which generates a heterodyne frequency, as explained above, with a value slightly different from the input frequency, in this case 13.5601 MHz. This heterodyne frequency is then mixed by the mixers 44, 46 with each of the voltage and current representative signals to generate sum and difference signals which are fed to respective low pass filters 50, 52. The filters 50, 52 eliminate the "sum" frequency and pass the difference frequency which in this case will be at 100 Hz and the output from the low pass filters is fed to each of a pair of processing amplifiers 54, 56.

Processing amplifier 54 creates a magnitude error signal, which falls to zero when the ratio of voltage and current equals 50 ohms. Processing amplifier 56 creates a phase error signal, which ideally falls to zero when the voltage and current at the input to the matching unit are in phase. (In practice, the derived phase signal is not exactly zero at match, and a non-zero control reference value is used. This value is selected initially by manual matching and noting the indicated offset value.) The right hand set of cross-over arrows indicate that the design has flexibility to drive either capacitor position from either control signal.

Figure 3A:
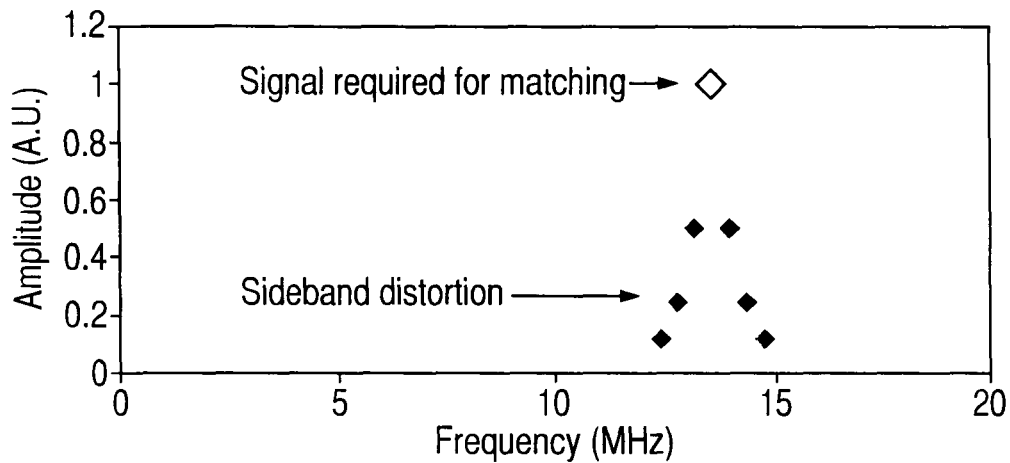
FIGS. 3a and 3b show a typical spectrum of a 13.56 MHz signal that has been mixed with an LF signal at 400 kHz in graphical form and as photographed from a spectral analyser respectively.
Figure 3B:
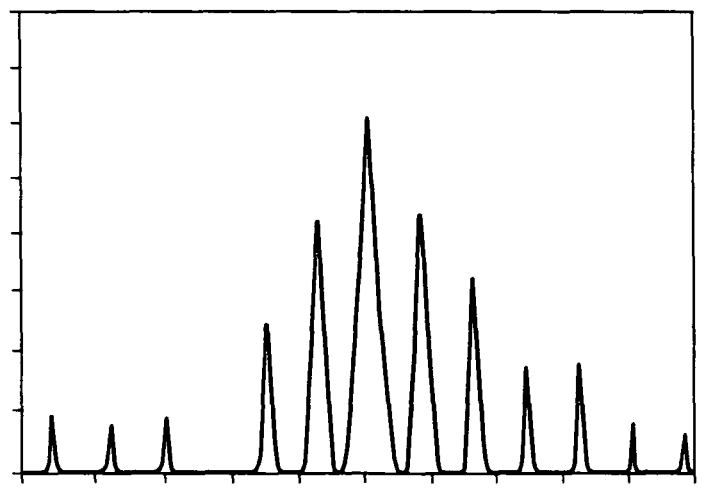

As described above, one of the problems addressed by the invention is where the plasma processing chamber 10 is supplied with more than one excitation frequency. Consider for example the case where the second excitation frequency is at 400 kHz. In that event, the signals detected by the sensor 36 will have the form shown in FIGS. 3a and 3b. In these Figures, the sidebands either side of the 13.56 MHz peak are evident and filtering the required frequency would be difficult.

Figure 4:
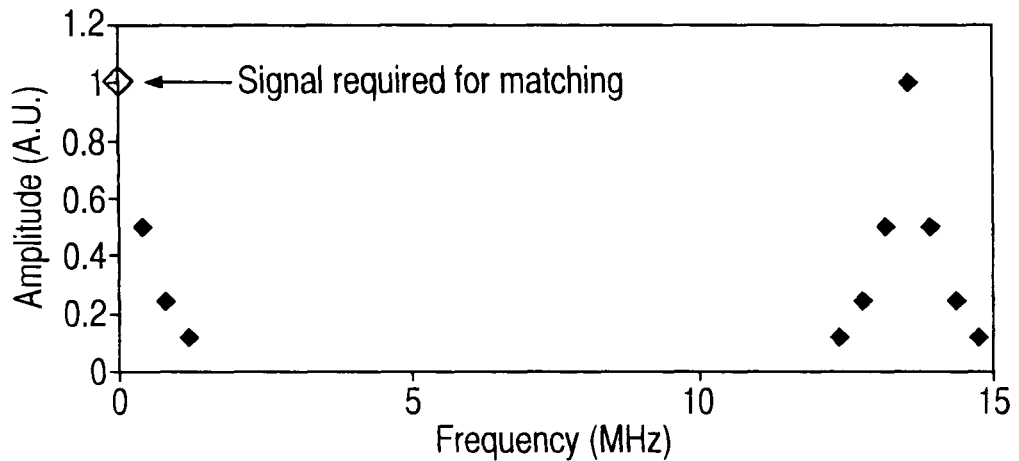
FIG. 4 shows the same spectrum as that shown in FIG. 3 after the heterodyne frequency conversion has been performed.
Figure 5:
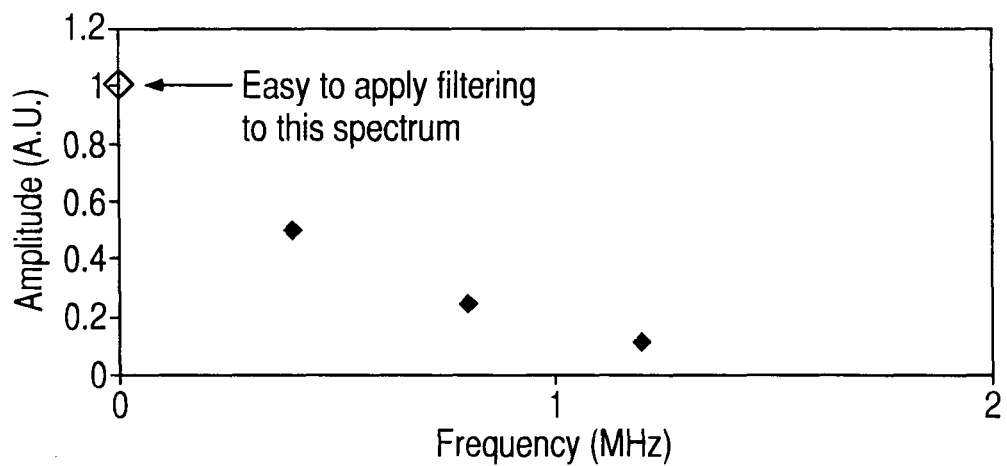
FIG. 5 shows the same information as FIG. 4 with more detail of the lower frequencies.

By applying a heterodyne frequency conversion, the signal required for matching at 100 Hz is well separated as seen in FIG. 4 and as can be seen more clearly in FIG. 5. Simple implementation of a low-pass filter then isolates the required signal to drive the impedance matching network, without interference or distortion from sideband elements.

Figure 6:
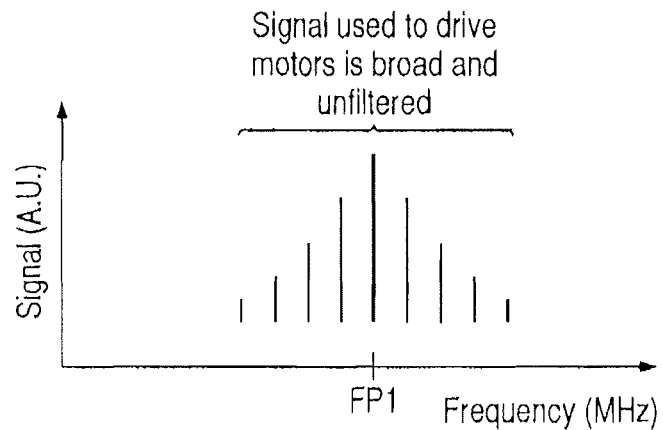
FIG. 6 illustrates the conventional signal use drive motors of the impedance matching network; and, FIG. 7 illustrates an example of a signal according to the invention for driving the impedance matching motors.

FIG. 6 illustrates how a conventional matching network operates around a frequency of a plasma generator FP1. A broadband detector is used to capture the necessary information to drive the motors which can be distorted due to the presence of side bands.

Figure 7:
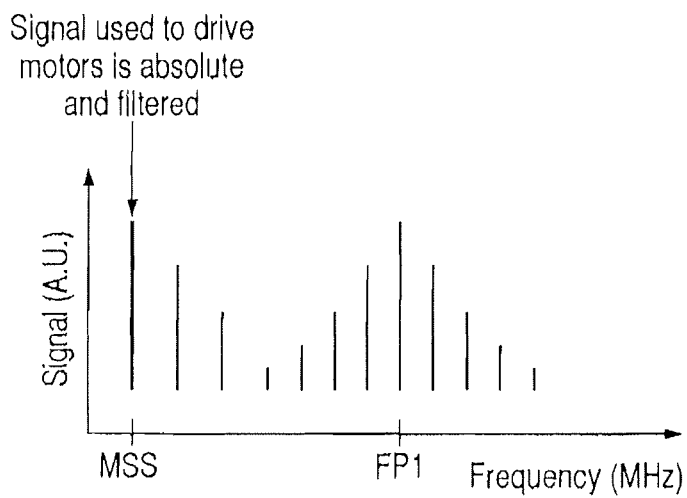

In contrast, FIG. 7 shows the result of heterodyning the detected spectrum so that it is frequency shifted to a lower frequency resulting in a Modified Sense Signal which is easily filtered to remove any unwanted side band interference.

The invention claimed is:

1. A signal generating system comprising a signal generator for generating an electrical signal at a first frequency; an impedance matching circuit arranged to supply the electrical signal from the signal generator to a reactive load; and an impedance matching circuit control system for detecting the electrical signal between the signal generator and the reactive load and for adjusting the impedance matching circuit to achieve a predetermined condition, wherein the impedance matching circuit control system comprises;
   a heterodyne frequency generator coupled to the signal generator to generate a second, heterodyne frequency from the first frequency from the signal generator;
   a mixer, wherein the heterodyne frequency is mixed with the detected signal at the mixer to generate sum and difference signal;
   a filter for passing the difference signal;
   and a processor responsive to the difference signal to adjust the impedance matching circuit to achieve the predetermined condition;
   the signal generating system being characterized in that the detected electrical signal from the signal generator is fed to both the heterodyne frequency generator which generates said heterodyne frequency, and the mixer.

2. A system according to claim 1, wherein the impedance matching circuit control system is adapted to generate two signals corresponding to the voltage and current respectively of the detected signal, each of the voltage and current representing signals being heterodyne converted by the impedance matching circuit control system.

3. A system according to claim 1, further comprising a second signal generator for generating an electrical signal at a second frequency different from the first frequency, the signal generated at the first frequency and the signal generated at the second frequency both being as applied to the same reactive load.

4. A system according to claim 3, wherein the heterodyne frequency (FLO) falls in a range defined as:

$$0.9 \times FP1 =< FLO < FP1 + (FP2/2)$$

where FP1 is the frequency of the signal generated by the signal generator and FP2 is the frequency of the signal generated by the second signal generator, both signals being applied to the same reactive load.

5. A system according to claim 1, wherein the impedance matching circuit comprises one or more reactances, the processor of the impedance matching circuit control system being adapted to vary the value of the or each reactance according to the difference signal.

6. A system according to claim 1, wherein the heterodyne frequency generator generates a heterodyne frequency that results in a difference signal below 20 kHz, preferably below 1 kHz.

7. A system according to claim 1, wherein the heterodyne frequency generator generates a heterodyne frequency that results in a different signal at or below 100 Hz.

8. A system according to claim 1, wherein the predetermined condition is the power reflected from the reactive load being less than 1% of the forward power.

9. A system according to claim 1, wherein the signal generator generates an electrical signal in the RF frequency range, for example 13.56 MHz.

10. A plasma chamber excitation system comprising a signal generating system according to claim 1.

11. A plasma chamber system comprising a plasma chamber in which a gas plasma is formed in use, the plasma chamber being coupled with a plasma chamber excitation system according to claim 10 for exciting a plasma within the chamber.

12. A plasma chamber system comprising:
   a plasma chamber in which a gas plasma is formed in use, the plasma chamber being coupled with a plasma chamber excitation system for exciting a plasma within the chamber, the plasma chamber excitation system comprising a signal generating system comprising a signal generator for generating an electrical signal at a predetermined frequency; an impedance matching circuit arranged to supply the electrical signal from the signal generator to a reactive load in use; and an impedance matching control system for detecting the electrical signal between the signal generator and the reactive load and for adjusting the impedance matching circuit to achieve a predetermined condition, characterized in that the impedance matching circuit control system comprises a heterodyne circuit, the system further comprising a heterodyne frequency generator coupled to the signal generator to generate a second, heterodyne frequency from the predetermined frequency from the signal generator for mixing with the detected signal to generate sum and difference signals, wherein the electrical signal from the signal generator is fed into the heterodyne frequency generator which generates said heterodyne frequency; a filter for passing the difference signal; and a processor responsive to the difference signal to adjust the impedance matching circuit to achieve the predetermined condition; and
   a second plasma chamber excitation system for exposing the plasma chamber to a second excitation frequency different from that generated by the one plasma chamber excitation system.

13. A plasma chamber system according to claim 12, wherein the second excitation frequency has a lower frequency than the excitation frequency generated by the one plasma chamber excitation system, for example 2 MHz compared with 13.56 MHz.

14. A plasma chamber system according to claim 12, wherein the second excitation frequency has a higher frequency than the excitation frequency generated by the one plasma chamber excitation system, for example 41 MHz compared with 13.56 MHz.

* * * * *